United States Patent
Brintzinger et al.

(10) Patent No.: US 6,919,264 B2
(45) Date of Patent: Jul. 19, 2005

(54) METHOD FOR THE SOLDER-STOP STRUCTURING OF ELEVATIONS ON WAFERS

(75) Inventors: Axel Brintzinger, Dresden (DE); Ingo Uhlendorf, Dresden (DE); Andre Schenk, Dresden (DE); Alexander Wollanke, Dresden (DE)

(73) Assignee: Infineon Technologies AG, Munich (DE)

( * ) Notice: Subject to any disclaimer, the term of this patent is extended or adjusted under 35 U.S.C. 154(b) by 88 days.

(21) Appl. No.: 10/656,042

(22) Filed: Sep. 5, 2003

(65) Prior Publication Data

US 2004/0087131 A1 May 6, 2004

(30) Foreign Application Priority Data

Sep. 5, 2002 (DE) .......................................... 102 41 589

(51) Int. Cl.[7] .............................................. H01L 21/44
(52) U.S. Cl. .......................................... 438/614; 438/613
(58) Field of Search ................................ 438/584, 597, 438/612, 613, 614, 652, 654, 669, 670, 674

(56) References Cited

U.S. PATENT DOCUMENTS

| 4,372,809 | A | 2/1983 | Grewal et al. ............... 156/656 |
| 6,125,043 | A | 9/2000 | Hauer et al. ................ 361/760 |
| 6,413,845 | B1 * | 7/2002 | Izumi et al. ................ 438/597 |
| 6,809,020 | B2 * | 10/2004 | Sakurai et al. .............. 438/613 |
| 6,838,368 | B1 * | 1/2005 | Ohsawa et al. ............. 438/614 |

FOREIGN PATENT DOCUMENTS

| DE | 3107943 | 9/1982 |
| DE | 3407784 | 9/1985 |
| DE | 19750073 | 5/1999 |
| EP | 0295914 | 12/1988 |
| JP | 5267280 | 10/1993 |

* cited by examiner

*Primary Examiner*—Michael Lebentritt
*Assistant Examiner*—Scott B. Geyer
(74) *Attorney, Agent, or Firm*—Baker Botts LLP; Manu J. Tejwani

(57) ABSTRACT

A method is provided for the solder-stop structuring of elevations on wafers, such as 3D contact structures in the form of resilient or compliant contact bumps, which are connected electrically via a metallization layer to a bonding pad on the wafer, the metallization layer extending over the 3D structure and consisting of a Cu/Ni layer which is covered with a Au layer. The present invention provides a method for the solder-stop structuring of elevations on wafers which can be implemented simply and reliably to produce a reliable solder stop and good flank protection of the 3D structure. According to the invention, a resist is deposited on the tip of a 3D structure and a solder stop layer is then deposited over the metallization, including the resist. The resist on the tip of the 3D structure, including the solder stop layer covering the resist, is subsequently removed so that the Au layer on the tip of the 3D structure is exposed.

10 Claims, 2 Drawing Sheets

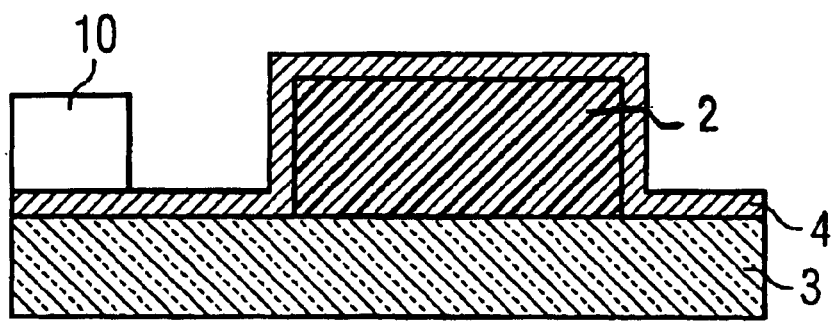
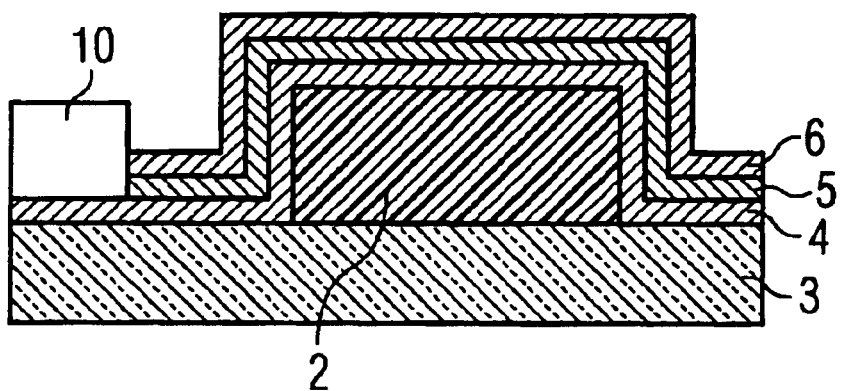
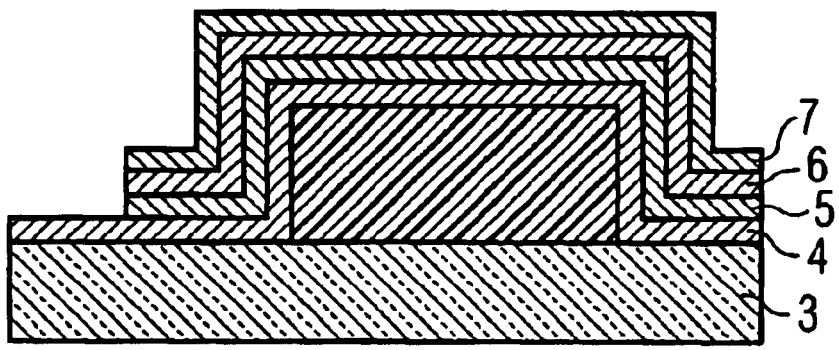

METHOD FOR THE SOLDER-STOP STRUCTURING OF ELEVATIONS ON WAFERS

BACKGROUND OF THE INVENTION

The increasing integration of semiconductor components, the increasing number of necessary electrical connections between semiconductor chips and carrier elements and, in particular, the requisite miniaturization with the aim of the flattest possible subassemblies, have led to the practice of making direct contact between semiconductor chips and carrier elements, e.g., flip-chip bonding. This practice has led to a considerable simplification of semiconductoir mounting technology, since metallic intermediate carriers and the production of wire links are no longer required in order to make electrical contact.

However, in order to make possible the direct contact between semiconductor chips and carrier elements such as printed circuit boards ("PCBs"), it is necessary to produce 3D structures, known as bumps or soldering mounds, on the semiconductor chip, which at their respective highest point have a gold-plated contact surface and are connected via a conductor track to a bonding pad of the wafer. These gold-plated contact surfaces can then be provided with a micro ball or the like of a solder material and connected electrically and mechanically to a corresponding soldering contact on the PCB.

In order to achieve a certain equalization of mechanical loadings on the completed subassemblies, for example caused by different thermal coefficients of expansion of the individual components or caused during their handling, the basic structure of the bumps is produced from a compliant material, e.g., silicone, so that a three-dimensional, mechanically flexible structure is produced.

The conductor tracks used for the electrical connection between the bonding pads and the bumps consist, for example, of a seed layer, on which a Cu conductor track and, above the Cu conductor track, a Ni layer are grown, the latter being used to protect the Cu layer against corrosion. A dielectric is used underneath the seed layer and the bumps to ensure that there is an electrical connection only between the gold-plated contact surface on the bump and the associated bonding pad.

In order to achieve solderability, the nickel layer must be coated with gold at the appropriate points, i.e., the tips of the three-dimensional ("3D") structures.

In the process, it is absolutely necessary to ensure that the gold coating is applied only to the tips of the 3D structures and that the redistribution layer, which leads down from the 3D structures, is absolutely free of gold. This creates a solder stop when the semiconductor chip is soldered onto a carrier element. Without this solder stop, the solder material would flow in an uncontrolled manner over the redistribution layer and have a detrimental effect on mechanical and electrical properties which could negatively impact the reliability of the finished electronic subassembly.

In the method commonly used in present manufcaturing processes, the necessary structuring of the gold layer is implemented by means of a generally known lithographic process. In this method, immediately after the seed layer and the Cu/Ni layer of the redistribution layer are applied, the gold is deposited on the entire redistribution layer. The gold layer is then covered by lithography in such a way that selective etching or stripping of the undesired gold layer can be performed. Upon completion of this method, a gold layer remains only immediately on the tip of the 3D structure.

In further detail, this currently-used method is performed using the following steps. First, the deposition of the seed layer is performed. Next, an EPR1 (epoxy photoresist 1) coating and structuring is applied during the first lithography step. Next, the reroute plating, production of the Cu/Ni layer on the seed layer is completed. The reroute trace is then coated with Au. Next, EPR2 (epoxy photoresist 2) coating and structuring is performed as a second lithography step. Finally, the Au layer is selectively etched using wet etching or removal/stripping techniques.

The result of this process is a 3D structure with a gold coating on its tip. However, the side flanks of the structure remain unprotected. While this may ensure that, during the subsequent connection of the wafer to a PCB, no solder material can flow away laterally over the flanks of the 3D structure (which could lead to functional disruption), the Ni layer is likewise exposed during the Au etching/stripping is accordingly completely unprotected against corrosion. This is a significant disadvantage of this known method.

In another method which is commonly used in practice, the 3D structures are initially connected to the associated bonding pad as already described with conductor tracks of Au-coated Cu/Ni layers and are subsequently embedded in a potting compound in such a way that only the tips of the 3D structures remain free. However, this method is difficult to perform properly and can be inefficient.

SUMMARY OF THE INVENTION

In a method according to the present invention, the solder-stop structuring of elevations on wafers which can be performed reliably while ensuring good flank protection of the 3D structure.

In one embodiment of a method in accordance with the present invention, a metallization layer is coated with an Au layer. Next, resist is deposited in a selected local solder area on the tip of a 3D contact structure Then a solder stop layer is deposited over the 3D contact structure, including the resist. Finally, the resist on the tip of the 3D structure is removed, including the solder stop layer covering said resist.

The present invention thereby provides a reliable method for solder-stop structuring of 3D structures. At the same time, effective flank protection of the Ni surface of the 3D structures is achieved. Corrosion of the Cu layer and of the Ni layer are prevented effectively, and the reliability of electronic subassemblies produced by this method is substantially improved.

BRIEF DESCRIPTION OF THE DRAWINGS

For a more complete understanding of the present invention, the needs satisfied thereby, and the objects, features, and advantages thereof, reference now is made to the following descriptions taken in connection with the accompanying drawings:

FIG. 1 shows a wafer with a 3D structure made of a compliant element following the deposition of the seed layer and the deposition of a photoresist EPR1;

FIG. 2 shows the 3D structure according to FIG. 1 after the coating with the Cu/Ni layer;

FIG. 3 shows the 3D structure according to FIG. 2 after the coating with a Au layer within the limitation by EPR1;

DETAILED DESCRIPTION OF THE INVENTION

Figure 4:
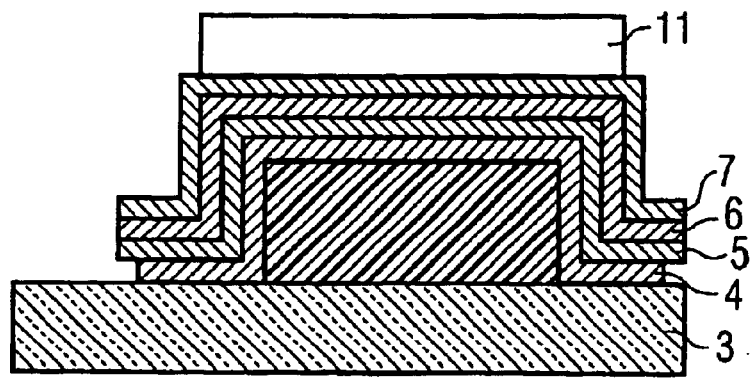
FIG. 4 shows the 3D structure after the etching of the seed layer and the coating with a resist on its tip or upper surface.
Figure 5:
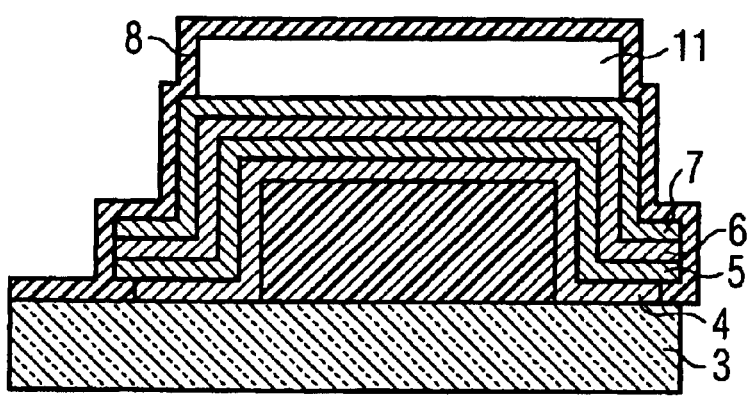
FIG. 5 shows the 3D structure after coating with a solder stop layer.
Figure 6:
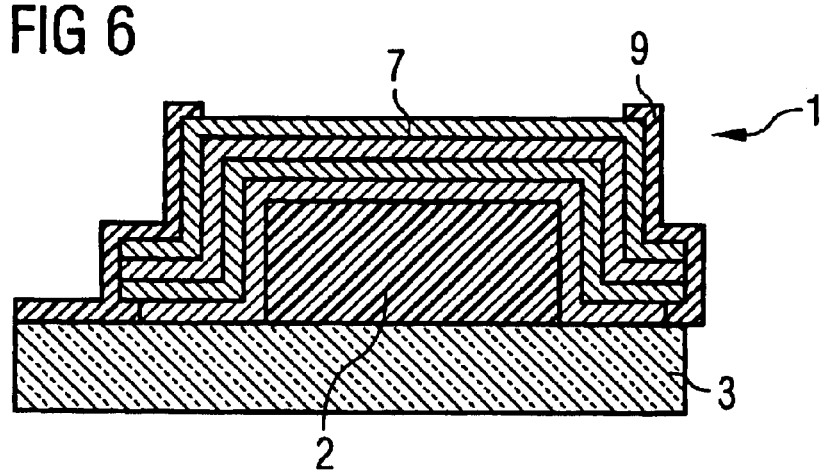
FIG. 6 shows the 3D structure after the thermal removal of the resist by means of a lift-off process.

FIGS. 1 through 6 show the method of producing a 3D structure 1 comprising a compliant element 2 on a wafer 3 with simultaneous solder-stop structuring. The finished 3D structure 1 is illustrated in FIG. 6. The structure comprises a seed layer 4, which has been deposited on the wafer 3 and enclosing the compliant element 2. Above the seed layer is a Cu layer 5 is deposited and, above that, a Ni layer 6 (FIG. 2).

The Ni layer 6 is covered by a thin solderable Au layer 7, which also extends laterally over the flanks of the 3D structure 1. The flanks of the 3D structure 1 and adjacent regions of the 3D structure 1 are covered with a solder stop layer 8 to ensure that, during a soldering operation, no solder material can flow down laterally from the 3D structure 1. This solder stop layer 8 leaves only the upper region of the Au layer 7 exposed, so that a subsequent soldering operation can extend only over the exposed surface of the Au layer 7. The solder stop layer 8 can also project slightly beyond the surface of the Au layer 7 forming a rim 9.

This 3D structure 1 is produced in accordance with the process flow which is described hereinafter. First, deposition of the seed layer 4 is performed on the wafer 3 and the compliant element. Next, a photoresist and structuring are applied to form an EPR1 mask 10. The resist used is preferably an epoxy photoresist which may be removed thermally by means of a lift-off step. Then a reroute plating step is performed by applying a Cu layer 5 and Ni layer 6. A final coating of Au layer 7 is applied. Next, the EPR1 mask 10 is removed and the exposed surfaces of the seed layer 4 are etched. Then the deposition and structuring of a resist 11 on the top surface of the Au layer is performed. The entire 3D structure 1 is then coated with the solder stop layer 8. Finally, the resist 11 and the solder stop material covering the resist are removed by means of a thermal lift-off process so that the Au layer 7 on the tip of the 3D structure 1 is exposed.

This method describes the production of a complete 3D structure 1. A description of the production of the conductor tracks between the 3D structure and associated bonding pad has been omitted since this is well-described in the art and can be performed using known methods.

In a further embodiment of the present invention, the solder stop layer may be deposited at least in the region of the 3D structure.

Furthermore, the layer structure of the conductor track is built up on a seed layer, which also encloses the resilient or compliant contact bump, by which means a metallization which adheres firmly can be produced.

In yet another exemplary embodiment of the present invention, the solder stop layer may consist of a mineral material such as boron nitride such that, during the thermal removal of the EPR or of another suitable resist, the solder stop layer on the EPR is also removed.

In another exemplary embodiment of the present invention, the Cu/Ni layers of the conductor track are deposited within the EPR1 mask and the EPR1 mask is then removed, the solder stop layer then being deposited.

While there have been described various embodiments of the invention, those skilled in the art will recognize that other changes and modifications may be made thereto without departing from the spirit of the invention, and it is intended to claim all such changes and modifications as fall within the true scope of the invention.

We claim:

1. A method for the solder-stop structuring of 3D contact structures on wafers having a metallization comprising a Cu/Ni layer, comprising the steps of:

coating the metallization layer with an Au layer;

depositing resist in a selected local solder area on the tip of a 3D contact structure;

depositing a solder stop layer over the 3D contact structure, including the resist; and removing the resist on the tip of the 3D structure, including the solder stop layer covering said resist.

2. The method according to claim 1, wherein the 3D contact structures comprise compliant contact bumps which are connected electrically via a metallization layer to a bonding pad on the wafer.

3. The method according to claim 1, wherein the resist used is an epoxy photoresist.

4. The method according to claim 3, wherein the resist is removed thermally by means of a lift-off step.

5. The method according to claim 1, wherein the resist is removed thermally by means of a lift-off step.

6. The method according to claim 1, wherein the solder stop layer is deposited at least in the region of the 3D structure.

7. The method according to claim 1, wherein the layer structure of the metallization is built up on a seed layer, which also encloses the resilient or compliant element.

8. The method according to claim 1, wherein the solder stop layer comprises a mineral material.

9. The method according to claim 1, further comprising the steps of:

depositing the Cu/Ni layers of the metallization within a first photoresist mask;

removing the first photoresist mask and the seed layer in the region outside the 3D structure; and thereafter depositing the solder stop layer.

10. The method according to claim 1, wherein the solder stop layer comprises boron nitride.

* * * * *